United States Patent
Park et al.

(10) Patent No.: US 11,177,205 B2
(45) Date of Patent: Nov. 16, 2021

(54) SEMICONDUCTOR PACKAGE HAVING MULTI-LEVEL AND MULTI-DIRECTIONAL SHAPE NARROWING VIAS

(71) Applicant: Samsung Electronics Co., Ltd., Suwon-si (KR)

(72) Inventors: Jung Ho Park, Cheonan-si (KR); Jong Youn Kim, Seoul (KR); Min Jun Bae, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 47 days.

(21) Appl. No.: 16/454,304

(22) Filed: Jun. 27, 2019

(65) Prior Publication Data

US 2020/0194362 A1    Jun. 18, 2020

(30) Foreign Application Priority Data

Dec. 18, 2018 (KR) .................. 10-2018-0164403

(51) Int. Cl.
| | | |
|---|---|---|
| *H01L 23/49* | (2006.01) | |
| *H01L 23/31* | (2006.01) | |
| *H01L 23/36* | (2006.01) | |
| *H01L 23/538* | (2006.01) | |
| *H01L 23/498* | (2006.01) | |
| *H01L 23/367* | (2006.01) | |

(Continued)

(52) U.S. Cl.
CPC .... *H01L 23/49838* (2013.01); *H01L 23/3128* (2013.01); *H01L 23/367* (2013.01);
(Continued)

(58) Field of Classification Search
CPC .......... H01L 23/49838; H01L 23/3128; H01L 23/367; H01L 23/49816; H01L 23/49822;
(Continued)

(56) References Cited

U.S. PATENT DOCUMENTS 8,952,270 B2 *   2/2015  Yamada ................. H05K 1/116
                                                             174/266
9,006,030 B1     4/2015  Kwon et al.
(Continued)

FOREIGN PATENT DOCUMENTS

JP    2010-157690 A    7/2010
JP    2014-154800 A    8/2014

OTHER PUBLICATIONS

European Search Report, dated May 4, 2020, for corresponding European Patent Application No. 19210744.9 (9 pages).

*Primary Examiner* — Ida M Soward
(74) *Attorney, Agent, or Firm* — Muir Patent Law, PLLC

(57) ABSTRACT

A semiconductor package includes a redistribution substrate having first and second surfaces opposed to each other, and including an insulation member, a plurality of redistribution layers on different levels in the insulation member, and a redistribution via having a shape narrowing from the second surface toward the first surface in a first direction; a plurality of UBM layers, each including a UBM pad on the first surface of the redistribution substrate, and a UBM via having a shape narrowing in a second direction, opposite to the first direction; and at least one semiconductor chip on the second surface of the redistribution substrate, and having a plurality of contact pads electrically connected to the redistribution layer adjacent to the second surface among the plurality of redistribution layers.

11 Claims, 8 Drawing Sheets

(51) Int. Cl.
*H01L 23/00* (2006.01)
*H01L 21/48* (2006.01)
*H01L 21/56* (2006.01)
*H01L 23/42* (2006.01)

(52) U.S. Cl.
CPC .. *H01L 23/49816* (2013.01); *H01L 23/49822* (2013.01); *H01L 23/5383* (2013.01); *H01L 23/5386* (2013.01); *H01L 24/08* (2013.01); H01L 21/4853 (2013.01); H01L 21/4857 (2013.01); H01L 21/568 (2013.01); H01L 23/42 (2013.01); H01L 2224/024 (2013.01); H01L 2224/0235 (2013.01); H01L 2224/02331 (2013.01); H01L 2224/02371 (2013.01); H01L 2224/08235 (2013.01)

(58) Field of Classification Search
CPC . H01L 23/5383; H01L 23/5386; H01L 24/08; H01L 2224/02331; H01L 2224/0235; H01L 2224/02371; H01L 2224/024; H01L 2224/0401; H01L 2224/08235
See application file for complete search history.

(56) References Cited

U.S. PATENT DOCUMENTS

| | | | |
|---|---|---|---|
| 9,704,790 B1 | 7/2017 | Wu et al. | |
| 9,935,072 B2 | 4/2018 | Jeong et al. | |
| 10,008,393 B2 | 6/2018 | Kim et al. | |
| 10,026,668 B1* | 7/2018 | Lee | H01L 21/31058 |
| 10,128,195 B2* | 11/2018 | Lin | H01L 24/17 |
| 10,446,478 B2* | 10/2019 | Jeong | H01L 23/49816 |
| 10,453,790 B2* | 10/2019 | Park | H01L 23/49822 |
| 10,665,535 B2* | 5/2020 | Lee | H01L 23/3185 |
| 2009/0283903 A1* | 11/2009 | Park | H01L 24/05 257/737 |
| 2010/0200279 A1 | 8/2010 | Kariya et al. | |
| 2011/0198749 A1 | 8/2011 | Lee et al. | |
| 2014/0225275 A1 | 8/2014 | Shimizu et al. | |
| 2015/0380334 A1* | 12/2015 | Hu | H01L 24/97 257/712 |
| 2016/0079190 A1 | 3/2016 | Yu et al. | |
| 2016/0086902 A1 | 3/2016 | Lu et al. | |
| 2016/0284620 A1 | 9/2016 | Hu | |
| 2017/0207180 A1 | 7/2017 | Arai et al. | |
| 2017/0287839 A1* | 10/2017 | Lee | H01L 21/76895 |
| 2017/0323853 A1 | 11/2017 | Hu et al. | |
| 2017/0358534 A1* | 12/2017 | Kim | H01L 23/5389 |
| 2017/0372998 A1 | 12/2017 | Chen | |
| 2018/0076103 A1* | 3/2018 | Jeon | H01L 23/045 |
| 2018/0158766 A1 | 6/2018 | Chien et al. | |
| 2018/0233443 A1 | 8/2018 | Sung et al. | |
| 2019/0131223 A1* | 5/2019 | Chang | H01L 25/105 |
| 2019/0252363 A1* | 8/2019 | Lin | H01L 21/4857 |
| 2020/0111730 A1* | 4/2020 | Heo | H01L 23/49811 |
| 2021/0082858 A1* | 3/2021 | Tsai | H01L 24/24 |

\* cited by examiner

SEMICONDUCTOR PACKAGE HAVING MULTI-LEVEL AND MULTI-DIRECTIONAL SHAPE NARROWING VIAS

CROSS-REFERENCE TO RELATED APPLICATION

This application claims the benefit of priority under 35 U.S.C. § 119 to Korean Patent Application No. 10-2018-0164403, filed on Dec. 18, 2018, in the Korean Intellectual Property Office, the disclosure of which is incorporated herein by reference in its entirety.

BACKGROUND

1. Field

The present inventive concept relates to a semiconductor package. More particularly, the present inventive concept relates to a semiconductor package including vias having tapered shapes.

2. Description of Related Art

The semiconductor package may be the result when a semiconductor chip, such as an integrated circuit, is implemented in a form suitable for use in an electronic product. As the electronics industry has developed in recent years, semiconductor packages have developed in various ways aimed at downsizing, weight saving, and manufacturing cost reductions.

As a method of manufacturing a semiconductor package, there may be provided a wafer level packaging (WLP) process. As semiconductor chips become more highly integrated, the size of semiconductor chips is gradually decreasing. However, as semiconductor chips become smaller, it becomes difficult to attach a desired number of solder balls, and handling and testing of the solder balls becomes difficult.

In addition, there may be a problem in that the number of boards to be mounted depends on the size of the semiconductor chip. To solve this problem, a fan-out panel level package incorporating redistribution layer (RDL) technology may be used.

SUMMARY

An aspect of the present inventive concept may be to provide a semiconductor package with high reliability by reducing undulations caused in a redistribution substrate having a redistribution layer.

According to certain exemplary embodiments, the disclosure is directed to a semiconductor package comprising: a redistribution substrate having first and second surfaces disposed opposite to each other, and including an insulation member, a plurality of redistribution layers disposed on different levels in the insulation member, and a redistribution via connecting the redistribution layers disposed on neighboring levels and having a shape narrowing from the second surface toward the first surface in a first direction; a plurality of under bump metallurgy (UBM) layers, each of the plurality of UBM layers including a UBM pad disposed on the first surface of the redistribution substrate, and a UBM via connected to a redistribution layer adjacent to the first surface among the plurality of redistribution layers and connected to the UBM pad, and having a shape narrowing in a second direction opposite to the first direction; and at least one semiconductor chip disposed on the second surface of the redistribution substrate, and having a plurality of contact pads electrically connected to a redistribution layer adjacent to the second surface among the plurality of redistribution layers.

According to certain exemplary embodiments, the disclosure is directed to a semiconductor package comprising: a redistribution substrate having first and second surfaces disposed opposite to each other, and including a plurality of insulation layers and a plurality of redistribution layers disposed between the plurality of insulation layers, wherein the plurality of redistribution layers include a first redistribution layer adjacent to the first surface, and at least one second redistribution layer disposed between the first redistribution layer and the second surface, each second redistribution layer having a redistribution via connected to the first redistribution layer or a neighboring second redistribution layer of the at least one second redistribution layer; a plurality of under bump metallurgy (UBM) layers disposed on the first surface of the redistribution substrate, each of the UBM layers having a UBM via connecting to the first redistribution layer; at least one semiconductor chip disposed on the second surface of the redistribution substrate, and having a contact pad electrically connected to the at least one second redistribution layer; and a molding portion disposed on the second surface of the redistribution substrate and covering the at least one semiconductor chip, wherein the redistribution via has a shape narrowing from the second surface toward the first surface in a first direction, and the UBM via has a shape narrowing in a second direction opposite to the first direction.

According to certain exemplary embodiments, the disclosure is directed to a semiconductor package comprising: a redistribution substrate having first and second surfaces disposed opposite to each other, and including an insulation member, and a plurality of redistribution layers disposed on different levels in the insulation member; an under bump metallurgy (UBM) layer including a UBM pad disposed on the first surface of the redistribution substrate, and a UBM via electrically connecting the UBM pad and the plurality of redistribution layers, and having a shape narrowing in a direction from the first surface toward the second surface; and at least one semiconductor chip disposed on the second surface of the redistribution substrate, and having a contact pad electrically connected to the plurality of redistribution layers, wherein the plurality of redistribution layers includes: a first redistribution layer disposed on a level adjacent to the first surface in the insulation member and composed of a planar conductive pattern, and a plurality of second redistribution layers disposed on different levels in the insulation member, each of the plurality of second redistribution layers having a redistribution via connected to the first redistribution layer or a neighboring second redistribution layer of the plurality of second redistribution layers.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, various embodiments of the present inventive concept will be described with reference to the accompanying drawings.

Figure 1:
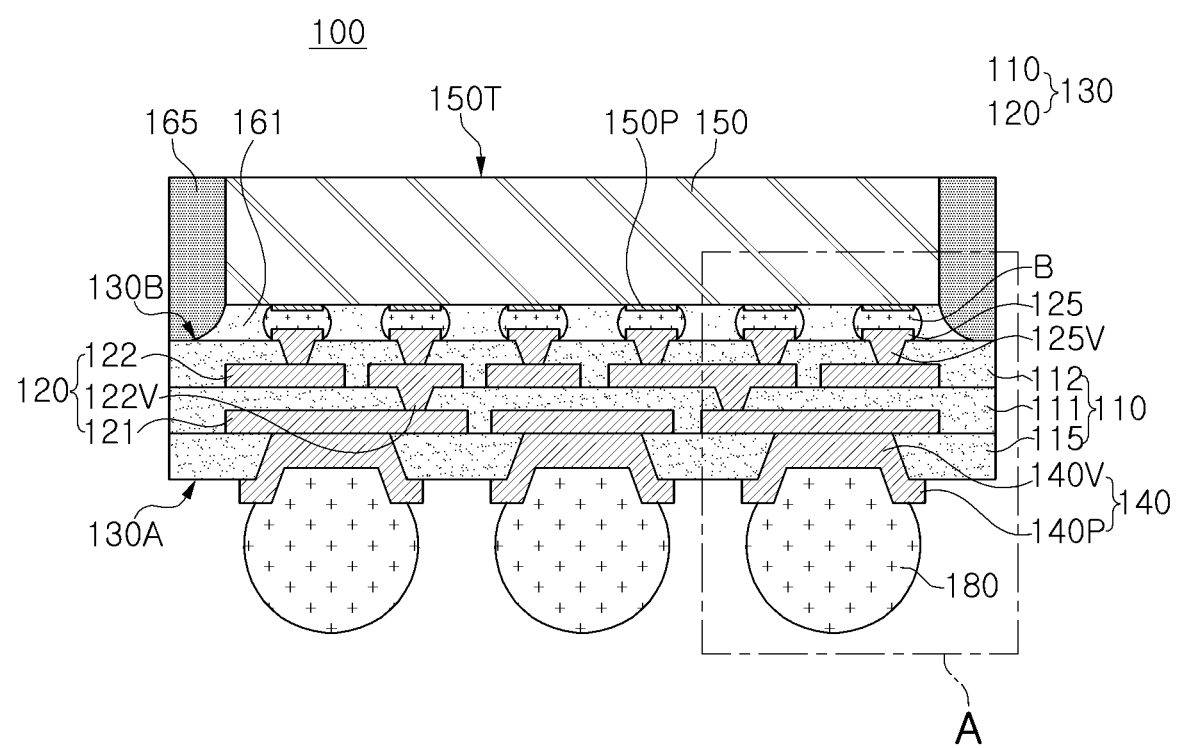
FIG. 1 is a cross-sectional view illustrating a semiconductor package according to an example embodiment.
Figure 2:
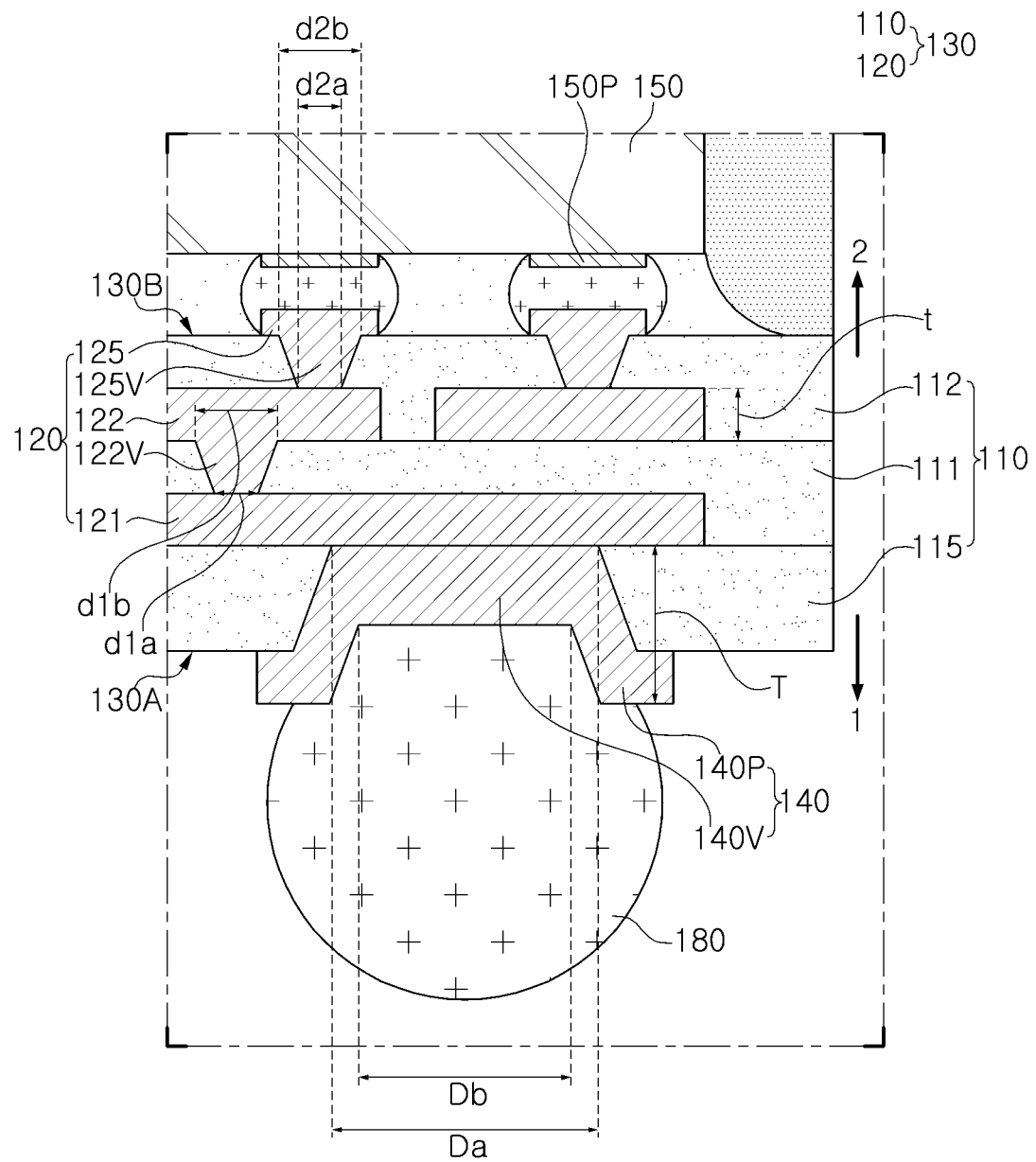
FIG. 2 is an enlarged cross-sectional view illustrating portion "A" of the semiconductor package illustrated in FIG. 1.

FIG. 1 is a cross-sectional view illustrating a semiconductor package according to an example embodiment, and FIG. 2 is an enlarged cross-sectional view illustrating portion "A" of the semiconductor package illustrated in FIG. 1.

Referring to FIG. 1, a semiconductor package 100 according to an example embodiment may be a semiconductor package in the form of a fan-out wafer level package (FOWLP). The semiconductor package 100 may include a redistribution substrate 130 having a first surface 130A and a second surface 130B disposed opposite each other and facing away from one another. The semiconductor package 100 may further include under bump metallurgy (UBM) layers 140 disposed on the first surface 130A of the redistribution substrate 130, and a semiconductor chip 150 disposed on the second surface 130B of the redistribution substrate 130.

The semiconductor chip 150 may include a semiconductor substrate having an active surface on which various discrete devices are formed, and an inactive surface opposite to the active surface. The semiconductor substrate may be a single semiconductor such as silicon (Si) and germanium (Ge), or a compound semiconductor such as SiC (silicon carbide), gallium arsenide (GaAs), indium arsenide (InAs), and indium phosphide (InP), or may have a silicon on insulator (SOI) structure. For example, the semiconductor substrate constituting the semiconductor chip 150 may include a buried oxide (BOX) layer. The various discrete devices may include a variety of microelectronic devices, such as a metal-oxide-semiconductor field effect transistor (MOSFET) such as a complementary metal-insulator-semiconductor (CMOS) transistor, a system large scale integration (LSI), an image sensor such as a CMOS imaging sensor (CIS), a microelectro-mechanical system (MEMS), an active device, a passive device, and the like.

The semiconductor chip 150 may include a plurality of contact pads 150P electrically connected to the discrete devices and disposed on the active surface.

The semiconductor chip 150 may be a memory chip or a logic chip. For example, the memory chip may be a volatile memory chip such as a dynamic random access memory (DRAM) or a static random access memory (SRAM), or a non-volatile memory chip such as a phase-change random access memory (PRAM), a magnetoresistive random access memory (MRAM), a ferroelectric random access memory (FeRAM), or a resistive random access memory (RRAM). In addition, the logic chip may be, for example, a microprocessor, an analog device, or a digital signal processor.

The redistribution substrate 130 may be used as an interposer for packaging the semiconductor chip 150 for mounting on a main board. As illustrated in FIG. 1, the redistribution substrate 130 may include an insulation member 110, and a redistribution structure 120 disposed on different levels in the insulation member 110. The insulation member 110 may include a plurality of insulation layers 111, 112, and 115, and the redistribution structure 120 may include a plurality of redistribution layers 121 and 122 disposed on boundary surfaces of the plurality of insulation layers 111, 112, and 115, respectively.

The boundary surfaces of the plurality of insulation layers 111, 112, and 115 may define formation locations of the redistribution layers 121 and 122, but the boundary surfaces of the plurality of insulation layers 111, 112, and 115 may not be directly observed visually in a final structure, according to some embodiments (e.g., when the plurality of insulation layers 111, 112, and 115 are formed of the same material). A portion of the plurality of redistribution layers 121 and 122 may include a redistribution via 122V connecting the redistribution layers 121 and 122 disposed on neighboring levels.

In some embodiments, the plurality of insulation layers 111, 112, and 115 may be made of a resin such as an epoxy or polyimide. For example, the plurality of insulation layers 111, 112, and 115 may be formed of a photosensitive insulating material. The redistribution layers 121 and 122 and the redistribution via 122V may include, for example, copper, nickel, stainless steel, or a copper alloy such as beryllium copper.

In particular, referring to FIG. 2, the structure of the redistribution substrate 130 employed in this embodiment will be described in detail. FIG. 2 is an enlarged cross-sectional view illustrating portion "A" of the semiconductor package illustrated in FIG. 1.

Referring to FIG. 2, the plurality of redistribution layers 121 and 122 may include a first redistribution layer 121 disposed between a base insulation layer 115 and a first insulation layer 111, and a second redistribution layer 122 disposed between the first insulation layer 111 and a second insulation layer 112. For example, the first redistribution layer 121 may be disposed on the base insulation layer 115 and be covered by the first insulation layer 111, and the second redistribution layer 122 may be disposed on the first insulation layer 111 and be covered by the second insulation layer 112. The first redistribution layer 121 may constitute a planar conductive pattern without a via structure for interlayer connection. Meanwhile, the second redistribution layer 122 may have the redistribution via 122V passing through the first insulation layer 111 and connected to the first redistribution layer 121. For example, the redistribution via 122V may electrically connect the second redistribution layer 122 to the first redistribution layer 121.

As described above, the first redistribution layer 121 disposed on a level adjacent to the first surface 130A in the insulation member 110 may constitute a planar conductive pattern, and the second redistribution layer 122 disposed on different levels in the insulation member 110 may have a redistribution via 122V for connection between neighboring levels.

The UBM layer 140 may partially pass through the insulation member 110, and may be connected to the first redistribution layer 121. As illustrated in FIG. 2, the UBM layer 140 may include a UBM pad 140P disposed on the first surface 130A of the redistribution substrate 130, and a UBM via 140V passing through the base insulation layer 115 and connected to the first redistribution layer 121 and the UBM pad 140P. For example, an upper surface of the UBM via 140V may be coplanar with an upper surface of the base insulation layer 115, and a lower surface of the UBM via 140V may be at a higher vertical level than a lower surface of the base insulation layer. Further, an upper surface of the UBM pad 140P may be adjacent to a lower surface of the base insulation layer 115, and a lower surface of the UBM pad 140P may be at a lower vertical level than the lower surface of the base insulation layer 115.

In this embodiment, the redistribution via 122V and the UBM via 140V may have a shape tapering in directions opposite to each other.

The redistribution via 122V may have a shape narrowing in a first direction 1 from the second surface 130B toward the first surface 130A. In some embodiments, when viewed in cross-section, the side surfaces of the redistribution via 122V extending in the first direction 1 may be planar surfaces. The redistribution via 122V may have a lower width d1a narrower than an upper width d1b. Meanwhile, the UBM via 140V may have a shape narrowing in a second direction 2, opposite to the first direction 1. In some embodiments, when viewed in cross-section, the side surfaces of the UBM via 140V extending in the second direction 2 may be planar surfaces. The UBM via 140V may have a lower width Da, wider than an upper width Db. A thickness T of the UBM layer 140 may be greater than a thickness t of the redistribution layer 121 or 122. For example, the thickness T of the UBM layer 140 may be about 10 μm or more. The thickness T of the UBM layer 140 may be the vertical distance between a vertical level that is coplanar with the upper surface of the UBM via 140V and a vertical level that is coplanar with the lower surface of the UBM pad 140P.

Figure 12:
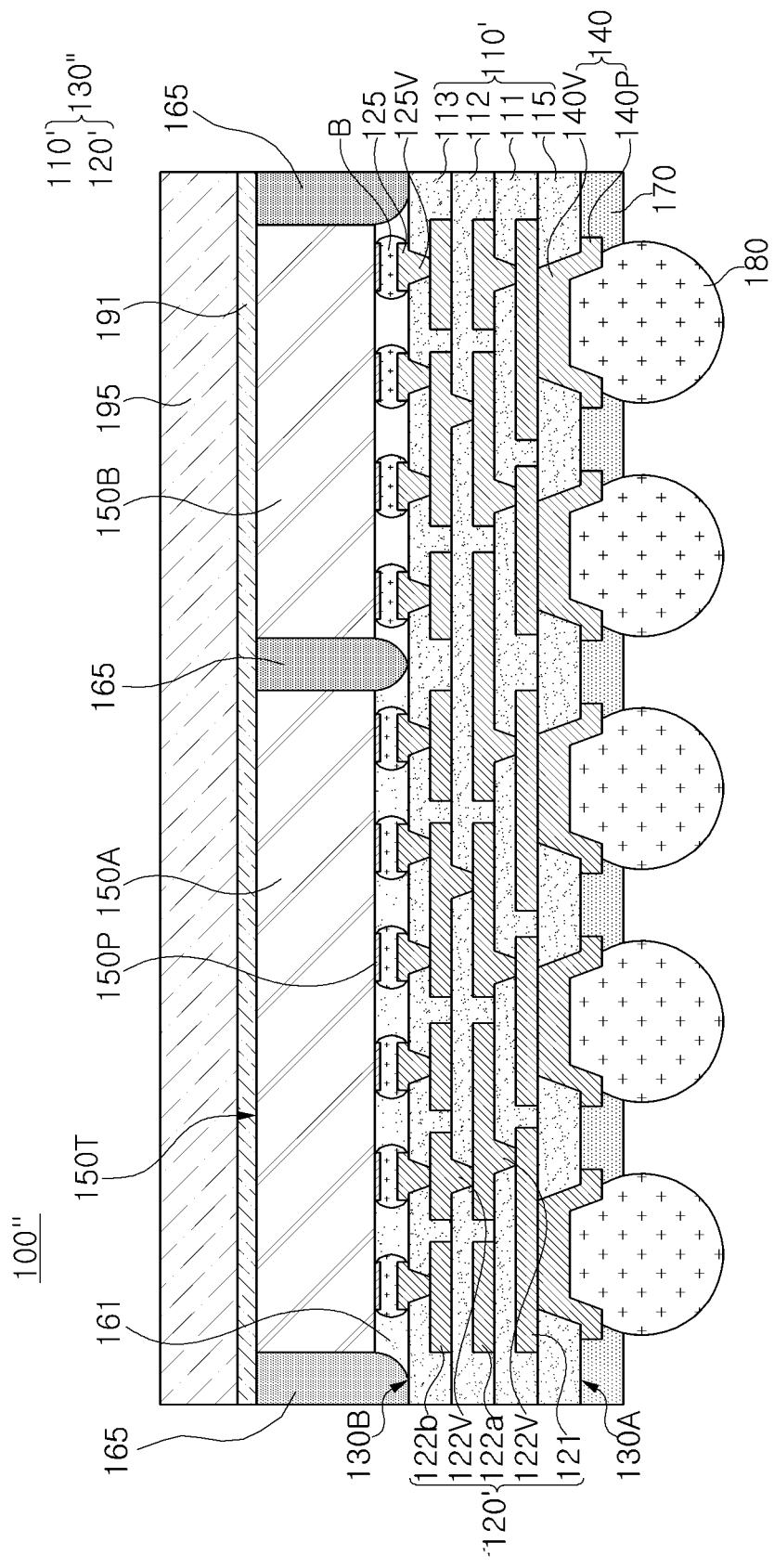
FIG. 12 is a cross-sectional view illustrating a semiconductor package according to an example embodiment.
Figure 13:
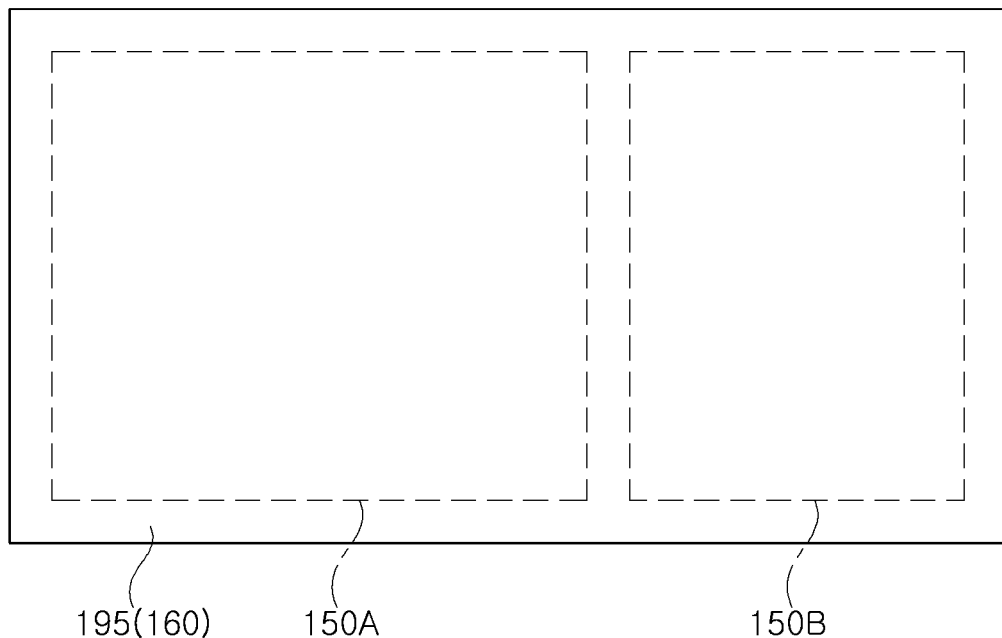
FIG. 13 is a plan view of the semiconductor package illustrated in FIG. 12.

In this embodiment, the second redistribution layer 122 may be illustrated as a single layer, but in another embodiment, may be included in a plurality of layers (see FIGS. 12 and 13).

As illustrated in FIG. 2, the UBM pad 140P may have a portion extending along a surface of the insulation member 110 located on the first surface 130A of the redistribution substrate 130. For example, the upper surface of the UBM pad 140P may face a lower surface of the insulation member 110, and contact a lower surface of the redistribution layer 121. As described above, the UBM pad 140P employed in this embodiment may be a non-solder mask defined (NSMD) type that is not defined by the base insulation layer 115, and may assure reliability of a board level by thermal shock.

In addition, the redistribution substrate 130 may include a plurality of bonding pads 125 disposed on the second surface 130B. The plurality of bonding pads 125 may partially pass through the insulation member 110, respectively, and may have a via portion 125V connected to the second redistribution layer 122 adjacent to the second surface 130B among the plurality of redistribution layers. The via portion 125V of the bonding pad 125 may have a shape narrowing in the first direction 1 from the second surface 130B toward the first surface 130A, in a manner similar to the redistribution via 122. The UBM via 125V may have a lower width d2a narrower than an upper width d2b. In some embodiments, when viewed in cross-section, the side surfaces of the UBM via 125V extending in the first direction 1 may be planar surfaces.

For example, the bonding pads may include copper, nickel, stainless steel, or a copper alloy such as beryllium copper, in a similar manner to the redistribution layers 121 and 122, and the redistribution via 122V.

The semiconductor chip 150 may be mounted on the first surface 130A of the redistribution substrate 130. The contact pads 150P of the semiconductor chip 150 may be connected to the bonding pads 125 using connection bumps B such as a solder, respectively. The semiconductor chip 150 may be electrically connected to the redistribution structure 120. The semiconductor package 100 may further include an underfill resin 161 disposed between the active surface of the semiconductor chip 150 and the second surface 130B of the redistribution substrate 130. The underfill resin 161 may be formed to surround a side surface of the connection bump B. For example, the underfill resin 161 may include an epoxy resin.

A molding portion 165 covering the semiconductor chip 150 may be formed on the second surface 130B of the redistribution substrate 130. An upper surface 150T of the semiconductor chip 150 may be exposed through an upper surface of the molding portion 165, and heat dissipation may be facilitated by the exposed upper surfaces of the semiconductor chip 150. The upper surface of the molding portion 165 may be ground to expose the upper surface 150T of the semiconductor chip 150. The upper surface 150T of the semiconductor chip 150 may be substantially coplanar with the upper surface of the molding portion 165. For example, the molding portion 165 may be formed of a hydrocarbon ring compound containing a filler. The filler may be, for example, an $SiO_2$ filler. In some embodiments, the molding portion 165 may be formed of Ajinomoto Build-up Film (ABF).

An external connector 180 may be attached to the UBM layer of the redistribution substrate 130. The external connector 180 may be, for example, a solder ball or a bump. The external connector 180 may electrically connect the semiconductor package 100 and an external device (e.g., a motherboard).

Therefore, a formation direction of the redistribution via 122V may have a direction opposite to a formation direction of the UBM via 140V. After a build-up process of the redistribution layer, a relatively thick UBM layer 140 may be finally formed by introducing a transfer process using additional carriers in the build-up process of the redistribution substrate 130.

This modification of the process sequence may greatly reduce the problem of undulation. Specifically, after the build-up process for the redistribution layer having a relatively thin thickness is performed using a first carrier, the UBM layer having a relatively thick thickness after the transfer process to the second carrier may be formed. Therefore, the problem of undulation may be greatly reduced.

FIGS. 3 to 10 are cross-sectional views of major processes illustrating a method of manufacturing a semiconductor package according to an example embodiment.

Figure 3:
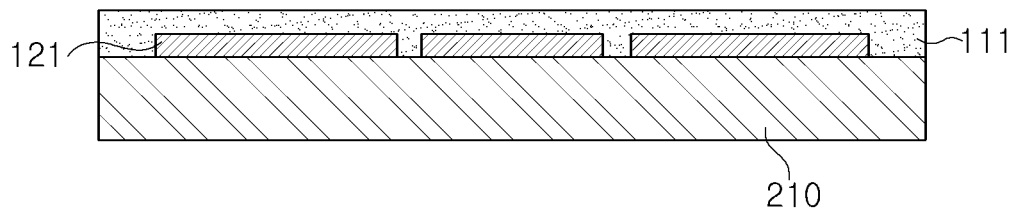
FIGS. 3 to 10 are cross-sectional views illustrating major processes of a method of manufacturing a semiconductor package according to an example embodiment.

Referring to FIG. 3, a first redistribution layer 121 may be disposed on a first carrier 210, and a first insulation layer 111 may be formed on the first carrier 210 to cover the first redistribution layer 121.

The first carrier 210 may be provided as a substrate for building up a redistribution structure. As described above, the first redistribution layer 121 may include a planar conductive pattern without an interlayer via structure. The first redistribution layer 121 may include, for example, copper, nickel, stainless steel, or a copper alloy such as beryllium copper. The first insulation layer 111 may include a resin such as an epoxy resin or a polyimide resin, and may be a resin not containing a filler. For example, the first insulation layer 111 may be formed of a photosensitive insulating material.

Figure 4:
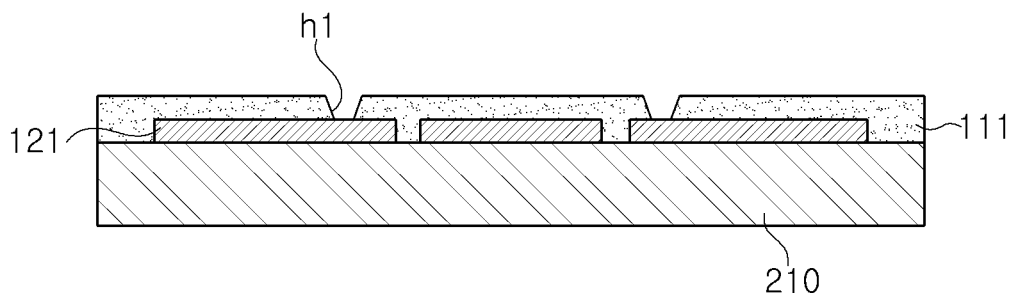

Next, referring to FIG. 4, a first hole h1 for interlayer connection may be formed in the first insulation layer 111.

When the first insulation layer 111 is a photosensitive insulating material, the first hole h1 having a minute size may be formed at a fine pitch for a photolithography process. For example, since an exposed area gradually decreases in a thickness direction of the first insulation layer 111, the first hole h1 may have a shape that becomes narrower as its horizontal cross-sectional area decreases. As such, an interlayer via defined by the first holes h1 (e.g., a redistribution via, a UBM via) may have a tapered shape gradually narrowing in a direction to be formed. In another embodiment, the first hole h1 may be formed by a laser drilling process using a UV laser or an excimer laser. The hole formed by the laser drilling process may also have a shape narrowing in a downward direction.

Figure 5:
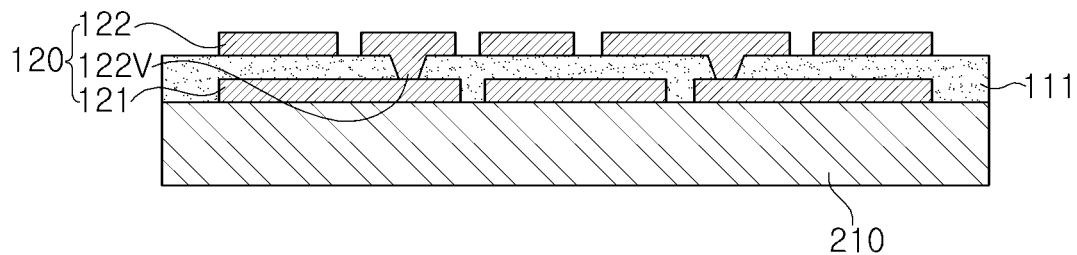

Referring to FIG. 5, a second redistribution layer 122 connected to the first redistribution layer 121 may be formed on the first insulation layer 111.

This operation may be performed by a plating process. Specifically, the second redistribution layer 122 may be formed by forming a seed layer along a surface of the first insulation layer 111 on which the first hole h1 is formed, and then by a plating process using a mask pattern (for example, a copper plating process). For example, the second redistribution layer may be formed by an immersion plating process, an electroless plating process, an electroplating process, or a combination thereof. The second redistribution layer 122 may be formed by removing a mask pattern to remove a plated portion of an undesired area using an ashing or strip process, and then, after the removal of the mask pattern, by removing an exposed portion of the seed layer using a chemical etching process.

Since the second redistribution layer 122 and the redistribution via 122V obtained by this process are formed by the same plating process as described above, the second redistribution layer 122 may have a continuously integrated structure with the redistribution via 122V. As used herein, the "continuously integrated structure" refers to a structure to be continuously integrated, without a discontinuous boundary surface (for example, a grain boundary), in which two components formed by a different process are not simply in contact (discontinuity), but are formed of the same material by the same process. For example, a continuously integrated structure may be a homogeneous monolithic structure.

In this embodiment, the second redistribution layer 122 may be referred to as a continuously integrated structure, since the same is formed together with the redistribution via 122V through the same plating process. Meanwhile, the first redistribution layer 121 and the redistribution via 122V may be not referred to as a continuously integrated structure, since they are formed by different processes, even when they are connected to each other.

Figure 6:
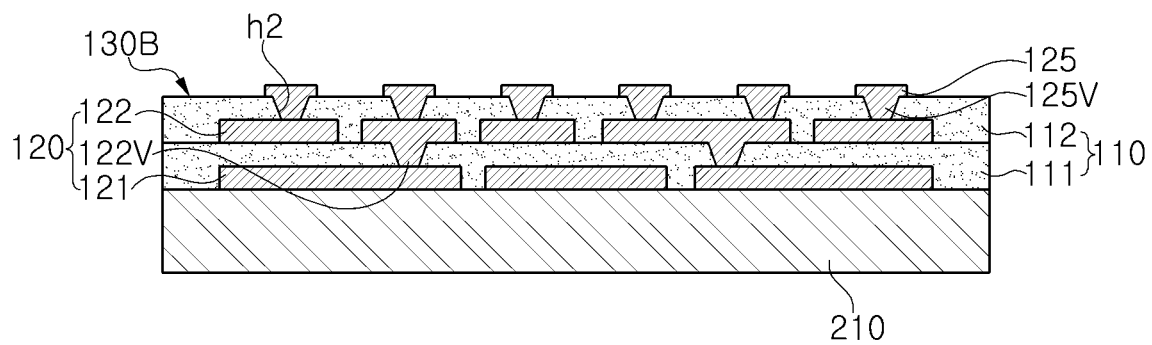

Referring to FIG. 6, after a second insulation layer 112 is formed, a bonding pad 125 connected to the second redistribution layer 122 may be formed on the second insulation layer 112.

Specifically, this operation may include a first operation of forming a second insulation layer 112 having a second hole h2, and a second operation of forming a bonding pad 125 having a via portion 125V connected to the second redistribution layer 122 through the second hole h2. The first operation may refer to the processes described in FIGS. 3 and 4, and the second operation may refer to the process described in FIG. 5.

Particularly, the second hole h2 may also have a shape in which a horizontal cross-sectional area thereof becomes narrower in a downward direction, in a similar manner to the first hole h1. Therefore, the via portion 125V of the bonding pad 125 defined by the second hole h2 may have a shape narrowing in a downward direction, in a similar manner to the redistribution via 122V.

Figure 7:
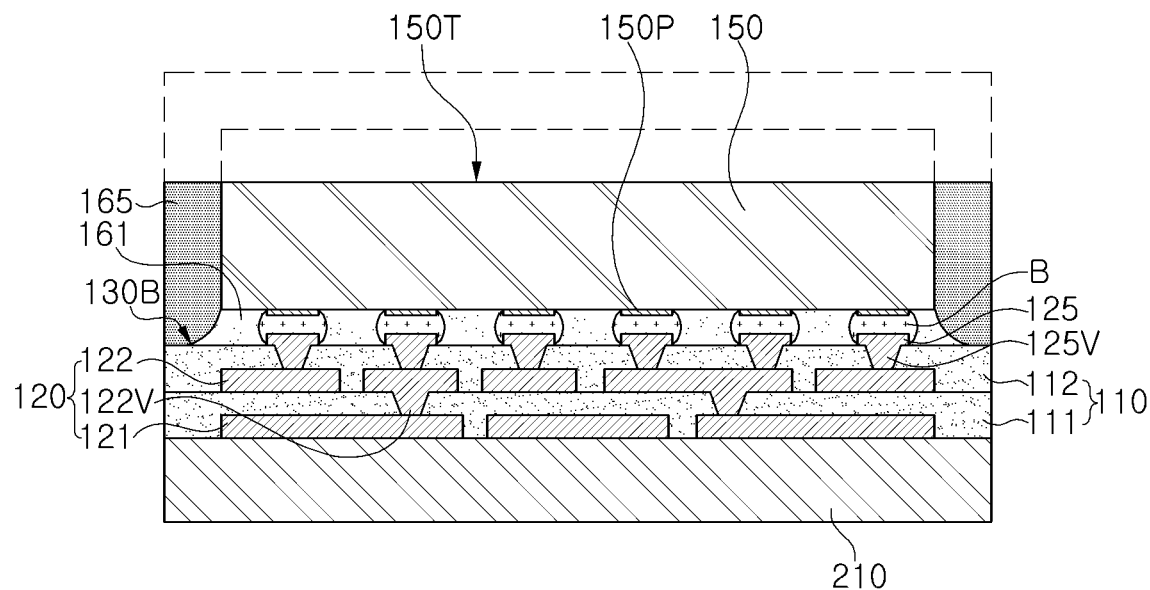

Referring to FIG. 7, a semiconductor chip 150 may be mounted on the redistribution structure, the final structure of FIG. 6, to form a molding portion 165 for protecting the semiconductor chip 150.

Contact pads 150P of the semiconductor chip 150 may be respectively connected to the bonding pads 125 by using connection bumps B such as a solder. As above, the semiconductor chip 150 may be electrically connected to the redistribution structure 120. An underfill resin 161 may be formed to surround a side surface of the connection bump B between an active surface of the semiconductor chip 150 and an upper surface of the redistribution structure. For example, the underfill resin 161 may include an epoxy resin.

The molding portion 165 may be formed to cover the semiconductor chip 150, and an upper surface of the molding portion 165 may be ground to expose an upper surface 150T of the semiconductor chip 150. In FIG. 7, the dotted lines indicate a portion of each of the semiconductor chip 150 and the molding portion 165 to be removed by a grinding process. The upper surface 150T of the semiconductor chip 150 may be exposed through the grinding process to improve a heat dissipating effect and to reduce the thickness of the semiconductor package at the same time. The upper surface 150T of the semiconductor chip 150 may be substantially coplanar with the upper surface of the molding portion 165. For example, the molding portion 165 may be formed of Ajinomoto Build-up Film (ABF).

Figure 8:
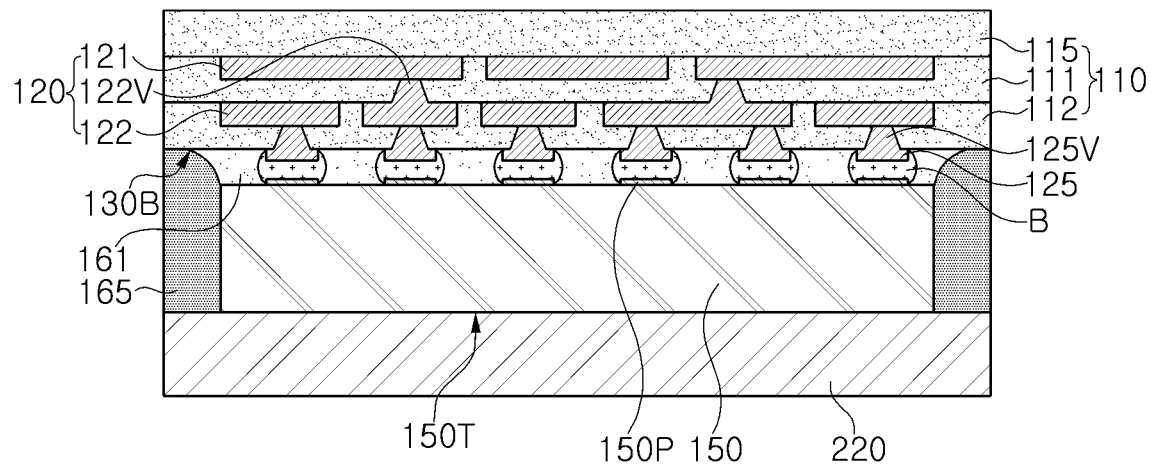

Next, referring to FIG. 8, after the redistribution structure is transferred to a second carrier 220, the first carrier 210 may be removed, and a base insulation layer 115 may be formed on the removed surface.

The base insulation layer 115 may include a resin such as an epoxy resin or a polyimide resin. For example, the base insulation layer 115 may be formed of the same material as the first and second insulation layers 111 and 112. In some embodiments, the base insulation layer 115 may be a photosensitive insulating material.

Figure 9:
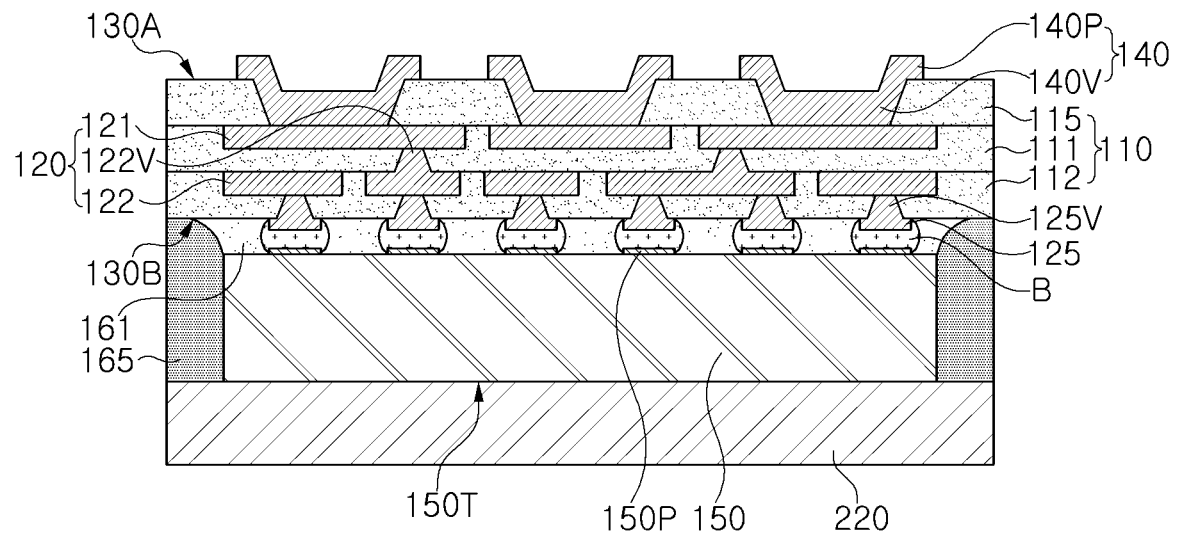

Referring to FIG. 9, openings, in which a portion of the first redistribution layer 121 is exposed, may be formed in the base insulation layer 115, and a plurality of UBM layers 140 connected to the first redistribution layer 121 may be formed. For example, openings may be formed in the base insulation layer 115 to expose portions of the upper surface of the first redistribution layer 121, and a plurality of UBM layers 140 may be formed to extend into these openings.

The UBM layer 140 may include a UBM pad 140P disposed on the base insulation layer 115, and a UBM via 140V connected to the first redistribution layer 121. The UBM layer 140 may be formed using a plating process, in a similar manner to the second redistribution layer 122 and the bonding pad 125. Therefore, the UBM pad 140P and the UBM via 140V may form a continuously integrated structure. For example, the UBM layer 140 may be a homogeneous monolithic structure.

In a different manner to the operation of forming the redistribution structure 120, the UBM layer 140 may be formed in a state of being transferred (being vertically inverted) to the second carrier 220, such that the UBM via 140V may have a shape narrowing in a direction opposite to the narrowing direction of the redistribution via 122V. For example, with reference to FIG. 2, the UBM via 140V may have a lower width Da wider than an upper width Db. A thickness of the UBM layer 140 may be greater than a thickness of the first or second redistribution layer 121 or 122, and, for example, may be about 10 μm or more.

Figure 10:
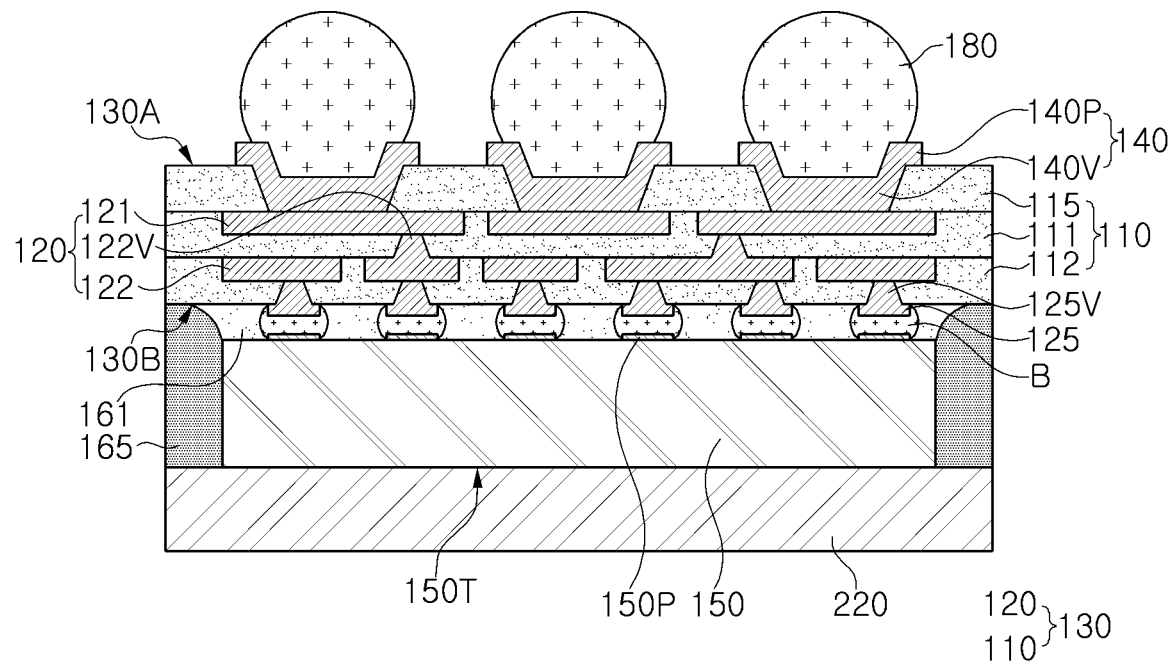

Next, referring to FIG. 10, an external connector 180 may be formed on the UBM layer 140. The external connector 180 may be, for example, a solder ball or a bump. The external connector 180 may electrically connect the semiconductor package 100 and an external device.

The above-described process may be changed into various forms. For example, the operation of mounting the semiconductor chip (see FIG. 7) may be performed after forming the UBM layer 140 (after the operation illustrated in FIG. 9). The redistribution structure may be illustrated as a two-level redistribution layer, and the second redistribution layer having a redistribution via may be illustrated as a single level, but the second redistribution layer may be introduced into a plurality of redistribution layers as desired. In this case, the operation of forming the second redistribution layer (FIGS. 3 to 5) may be repeatedly performed as many times as necessary, before the operation of forming the bonding pad (FIG. 6).

Figure 11:
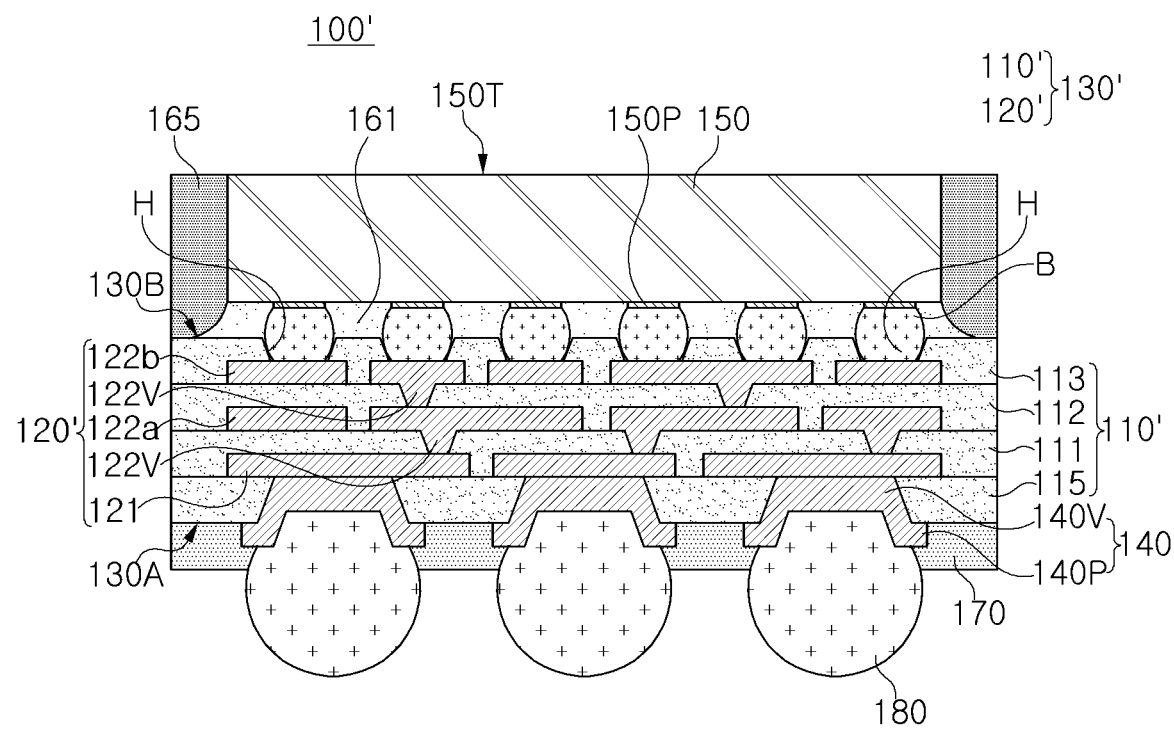
FIG. 11 is a cross-sectional view illustrating a semiconductor package according to an example embodiment.

FIG. 11 is a cross-sectional view illustrating a semiconductor package according to an example embodiment.

Referring to FIG. 11, a semiconductor package 100' according to this example embodiment can be understood to have a structure similar to the embodiments illustrated in FIGS. 1 and 2, except that a redistribution substrate 130' having a different configuration is provided and a passivation layer 170 is further added. Therefore, the descriptions of the embodiments illustrated in FIGS. 1 and 2 may be combined with the description of this embodiment, unless otherwise specifically stated.

The redistribution substrate 130' employed in this embodiment may include three levels of redistribution structure 120'. An insulation member 110' may include a base insulation layer 115 and first to third insulation layers 111, 112, and 113, and may also include a first redistribution layer 121 and two second redistribution layers 122a and 122b, located on respective boundary surfaces of the insulation layers 115, 111, 112, and 113.

In a different manner to the previous embodiment, the redistribution substrate 130' may not include a bonding pad (e.g., bonding pad 125 in FIG. 1). In particular, a connection structure between a semiconductor chip 150 and the redistribution structure 120' may be made by forming an opening H on an insulation layer adjacent to a second surface 130B of the redistribution substrate 130' (a third insulation layer 113), and by directly connecting a contact pad 150P of the semiconductor chip 150 and a portion of the second redistribution layer 122b exposed by the opening H using a connection bump B.

The semiconductor package 100' may further include the passivation layer 170 disposed on a first surface 130A of the redistribution substrate 130'. The passivation layer 170 may expose at least a portion of an UBM layer 140, and an external connector 180 may be formed at the open UBM layer 140. In some embodiments, the insulation layers 115, 111, 112, and 113 and the passivation layer 170 may be formed of the same material. For example, the insulation layers 115, 111, 112, and 113 and the passivation layer 170 may include a photosensitive insulating material. In some embodiments, the passivation layer 170 may include an insulating material different from the insulation member 110'. For example, the insulation layers 115, 111, 112, and 113 and the passivation layer may include a photosensitive insulating material, and the passivation layer 170 may be formed of a hydrocarbon ring compound containing a filler. For example, the passivation layer 170 may include ABF.

Also in this embodiment, in a similar manner to the previous embodiments, by introducing the UBM layer 140 in the latter half of the build-up process for the redistribution substrate 130', the problem of undulation due to a thickness of the UBM layer 140 may be greatly reduced to increase reliability of the semiconductor package.

FIG. 12 is a cross-sectional view illustrating a semiconductor package according to an example embodiment, and FIG. 13 is a plan view of the semiconductor package illustrated in FIG. 12.

Referring to FIGS. 12 and 13, a semiconductor package 100" according to this embodiment can be understood to have a structure similar to the embodiments illustrated in FIGS. 1 and 2, except that a plurality of semiconductor chips 150A and 150B and a heat dissipating plate 195 are included. Therefore, the descriptions of the embodiments illustrated in FIGS. 1 and 2 may be combined with the description of this embodiment, unless otherwise specifically stated.

A redistribution substrate employed in this embodiment may include three levels of redistribution structure 130", similar to the redistribution substrate 130' illustrated in FIG. 12, and may include a passivation layer 170 disposed on a first surface of a redistribution substrate.

In this embodiment, first and second semiconductor chips 150A and 150B may be mounted on a second surface 130B of the redistribution substrate 130". Contact pads of the first and second semiconductor chips may be connected respectively to bonding pads by connection bumps. A molding portion 165 covering a portion or all of the first and second semiconductor chips 150A and 150B may be formed. The molding portion 165 may include, for example, an epoxy mold compound. In a similar manner to the previous embodiment, the molding portion 165 may be coplanar with upper surfaces of the first and second semiconductor chips 150A and 150B.

The semiconductor package 100" according to this embodiment may further include a thermal conductive material layer 191 and a heat dissipating plate 195 sequentially arranged on the upper surfaces of the first and second semiconductor chips 150A and 150B. The thermal conductive material layer 191 may be disposed between the heat dissipating plate 195, and the first and second semiconductor chips 150A and 150B and the molding portion 165. The thermal conductive material layer 191 may assist to smoothly discharge heat generated from the first and second semiconductor chips 150A and 150B to the heat dissipating plate 195. The thermal conductive material layer 191 may be made of a thermal interface material (TIM). For example, the thermal conductive material layer 191 may be formed of an insulating material, or may be formed of a material including an insulating material and be capable of maintaining electrical insulation. The thermal conductive material layer 191 may include, for example, an epoxy resin. Specific examples of the thermal conductive material layer 191 may include a mineral oil, a grease, a gap filler putty, a phase change gel, a phase change material pad, or a particle-filled epoxy.

The heat dissipating plate 195 may be disposed on the heat conductive material layer 191. The heat dissipating plate 195 may be, for example, a heat sink, a heat spreader, a heat pipe, or a liquid cooled cold plate.

Figure 14:
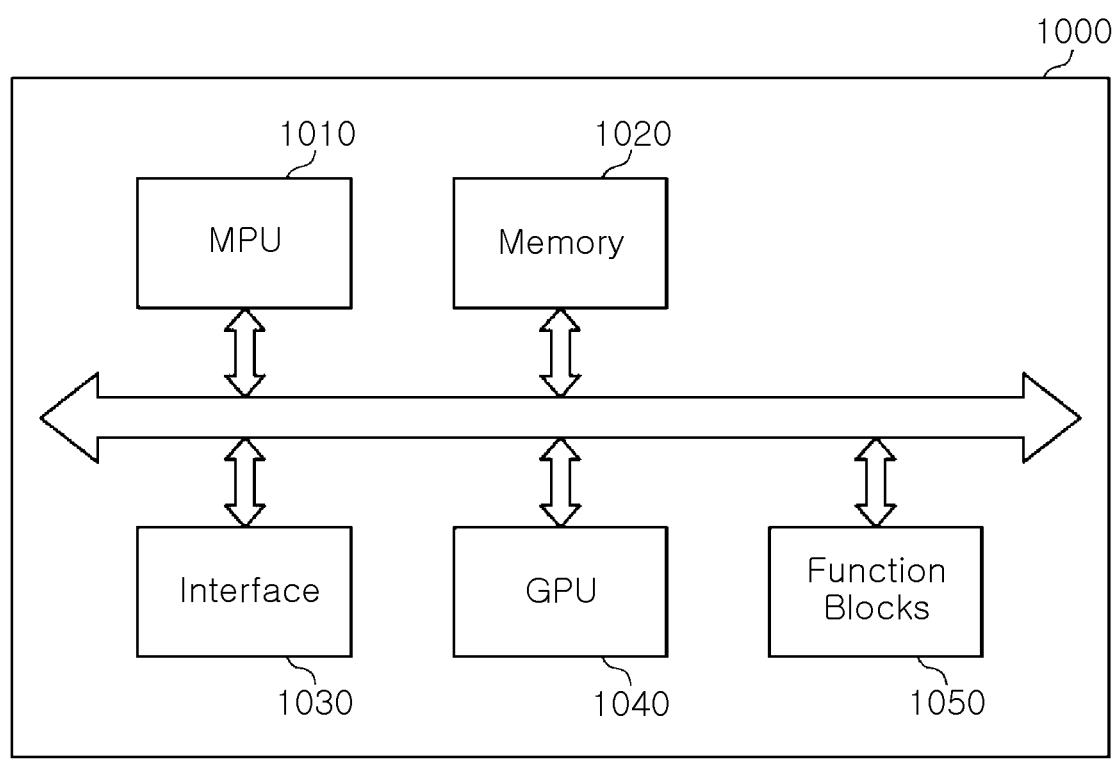
FIG. 14 is a block diagram illustrating a configuration of a semiconductor package according to an example embodiment.

FIG. 14 is a block diagram illustrating a configuration of a semiconductor package according to an example embodiment.

Referring to FIG. 14, a semiconductor package 1000 may include a microprocessor 1010, a memory 1020, an interface 1030, a graphics processor (GPU) 1040, functional blocks 1050, and a bus 1060 connecting therebetween. The semiconductor package 1000 may include both the microprocessor 1010 and the graphics processor 1040, or may include only one thereof.

The microprocessor 1010 may include a core and an L2 cache. For example, the microprocessor 1010 may include a multi-core. Each core of the multi-core may have the same or different performance. Further, the cores of the multi-core may be activated at the same time, or may be activated at different times from each other.

The memory 1020 may store results, and the like, processed in the functional blocks 1050 under the control of the microprocessor 1010. The interface 1030 may exchange information and signals with external devices. The graphics processor 1040 may perform graphics functions. For example, the graphics processor 1040 may perform a video codec or process 3D graphics. The functional blocks 1050 may perform various functions. For example, when the semiconductor package 1000 is an application processor (AP) used in a mobile device, a portion of the functional blocks 1050 may perform a communications function. Here, the semiconductor package 1000 may include one or more of the semiconductor packages 100, 100', and 100" described in FIGS. 1, 11, and 12.

According to example embodiments, the problem of undulation due to the thickness of the UBM layer may be greatly reduced to enhance the reliability of the semiconductor package by introducing the UBM layer in the second half of the build-up process for the redistribution substrate. In some embodiments, the UBM layer may be formed in a non-solder mask defined (NSMD) form in which the pad portion is not in contact with the outer insulation layer.

The various and advantageous advantages and effects of the present inventive concept may be not limited to the above description, and may be more easily understood in the course of describing a specific embodiment of the present inventive concept.

While example embodiments have been illustrated and described above, it will be apparent to those skilled in the art that modifications and variations could be made without departing from the scope of the present inventive concept as defined by the appended claims.

What is claimed is:

1. A semiconductor package comprising:
 a redistribution substrate having first and second surfaces disposed opposite to each other, and including an insulation member, a plurality of redistribution layers disposed on different levels in the insulation member, and a redistribution via connecting the redistribution layers disposed on neighboring levels and having a shape narrowing from the second surface toward the first surface in a first direction;
 a plurality of under bump metallurgy (UBM) layers, each of the plurality of UBM layers including a UBM pad disposed on the first surface of the redistribution substrate, and a UBM via connected to a redistribution layer adjacent to the first surface among the plurality of redistribution layers and connected to the UBM pad, and having a shape narrowing in a second direction opposite to the first direction; and
 at least one semiconductor chip disposed on the second surface of the redistribution substrate, and having a plurality of contact pads electrically connected to a redistribution layer adjacent to the second surface among the plurality of redistribution layers,
 wherein the UBM pad has a recessed portion in an area overlapping with the UBM via,
 wherein each of the plurality of UBM layers has a thickness greater than a thickness of the redistribution layer adjacent to the first surface, and each of the plurality of UBM layers has a thickness of 10 μm or more, and
 wherein the insulation member includes a plurality of first insulation layers, each of the plurality of first insulation layers surrounding the redistribution via, and a second insulating layer surrounding the UBM via, and the plurality of first insulation layers and the second insulating layer comprise a photosensitive insulating material.

2. The semiconductor package according to claim 1, wherein the redistribution substrate further comprises a plurality of bonding pads disposed on the second surface, each of the plurality of bonding pads connected to a corresponding one of the plurality of contact pads, and
 wherein each of the plurality of bonding pads has a via portion partially passing through the insulation member and connected to the redistribution layer adjacent to the second surface among the plurality of redistribution layers.

3. The semiconductor package according to claim 2, wherein the via portion has a shape narrowing in the first direction.

4. The semiconductor package according to claim 1, wherein the insulation member has a plurality of holes for exposing a portion of the redistribution layer adjacent to the second surface, and the plurality of contact pads are respectively connected to the redistribution layer adjacent to the second surface through the plurality of holes.

5. The semiconductor package according to claim 1, wherein the insulation member comprises a photosensitive insulating material.

6. The semiconductor package according to claim 1, wherein the UBM pad has a portion extending along a surface of the insulation member located on the first surface of the redistribution substrate.

7. The semiconductor package according to claim 1, further comprising:
 a passivation layer disposed on the first surface of the redistribution substrate and exposing at least a portion of the plurality of UBM layers; and
 a plurality of external connectors disposed on the plurality of UBM layers, respectively.

8. The semiconductor package according to claim 7, wherein the passivation layer comprises a photosensitive insulating material.

9. The semiconductor package according to claim 7, wherein the passivation layer comprises an insulating material different from a material comprising the insulation member.

10. The semiconductor package according to claim 1, further comprising:
 a molding portion disposed on the second surface of the redistribution substrate and covering the at least one semiconductor chip.

11. A semiconductor package comprising:
 a redistribution substrate having first and second surfaces disposed to opposite each other, and including an insulation member, and a plurality of redistribution layers disposed on different levels in the insulation member;

an under bump metallurgy (UBM) layer including a UBM pad disposed on the first surface of the redistribution substrate, and a UBM via electrically connecting the UBM pad and the plurality of redistribution layers, and having a shape narrowing in a direction from the first surface toward the second surface; and at least one semiconductor chip disposed on the second surface of the redistribution substrate, and having a contact pad electrically connected to the plurality of redistribution layers, wherein the plurality of redistribution layers includes:
- a first redistribution layer disposed on a level adjacent to the first surface in the insulation member and composed of a planar conductive pattern, and
- a plurality of second redistribution layers disposed on different levels in the insulation member, each of the plurality of second redistribution layers having a redistribution via connected to the first redistribution layer or a neighboring second redistribution layer of the plurality of second redistribution layers and having a shape narrowing from the second surface toward the first surface, wherein the UBM pad has a recessed portion in an area overlapping with the UBM via, wherein each of the plurality of UBM layers has a thickness greater than a thickness of the redistribution layer adjacent to the first surface, and each of the plurality of UBM layers has a thickness of 10 μm or more, and wherein the insulation member includes a plurality of first insulation layers, each of the plurality of first insulation layers surrounding the redistribution via, and a second insulating layer surrounding the UBM via, and the plurality of first insulation layers and the second insulating layer comprise a photosensitive insulating material.

* * * * *